United States Patent

Sawada

[11] Patent Number: 5,808,961
[45] Date of Patent: Sep. 15, 1998

[54] INTERNAL CLOCK GENERATING CIRCUIT FOR CLOCK SYNCHRONOUS TYPE SEMICONDUCTOR MEMORY DEVICE

[75] Inventor: Seiji Sawada, Hyogo, Japan

[73] Assignee: Mitsubishi Denki Kabushiki Kaisha, Tokyo, Japan

[21] Appl. No.: 901,243

[22] Filed: Jul. 25, 1997

[30] Foreign Application Priority Data

Feb. 18, 1997 [JP] Japan ..................................... 9-033836

[51] Int. Cl.⁶ ...................................................... G11C 8/00
[52] U.S. Cl. ........................ 365/233; 365/194; 365/233.5
[58] Field of Search ............................... 365/233, 230.01, 365/233.5, 201, 194, 189.05, 189.12

[56] References Cited

U.S. PATENT DOCUMENTS

| | | | |
|---|---|---|---|
| 5,581,512 | 12/1996 | Kitamura | 365/233 |
| 5,619,463 | 4/1997 | Malhi | 365/233 |
| 5,666,321 | 9/1997 | Schaefer | 365/233 |
| 5,666,324 | 9/1997 | Kosugi et al. | 365/233 |

FOREIGN PATENT DOCUMENTS

| | | |
|---|---|---|
| 7-201175 | 8/1995 | Japan . |
| 8-83498 | 3/1996 | Japan . |
| 8-180677 | 7/1996 | Japan . |

Primary Examiner—Son T. Dinh
Attorney, Agent, or Firm—McDermott, Will & Emery

[57] ABSTRACT

An internal clock signal generation circuit includes a portion to generate an internal clock signal (intCLK) generated in synchronization with an external clock signal, a pulse width setting circuit which sets the pulse width of the internal clock signal depending the operation condition. By adjusting the pulse width of the internal clock signal to generate depending upon the operation condition, an internal clock signal having an optimum pulse may be readily generated. An internal clock signal having an optimum pulse width depending upon the operation condition may be generated accordingly, and internal data may be accurately transferred as a result.

8 Claims, 11 Drawing Sheets

F I G. 1
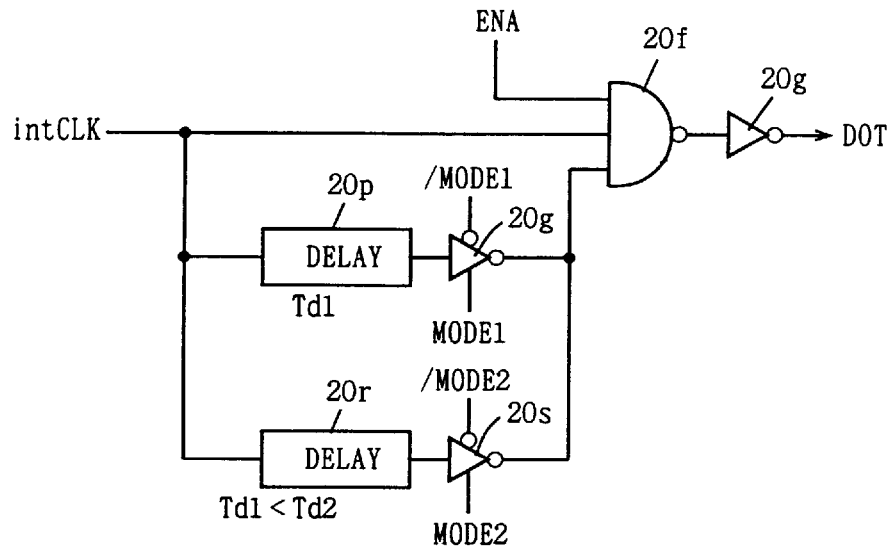
F I G. 2
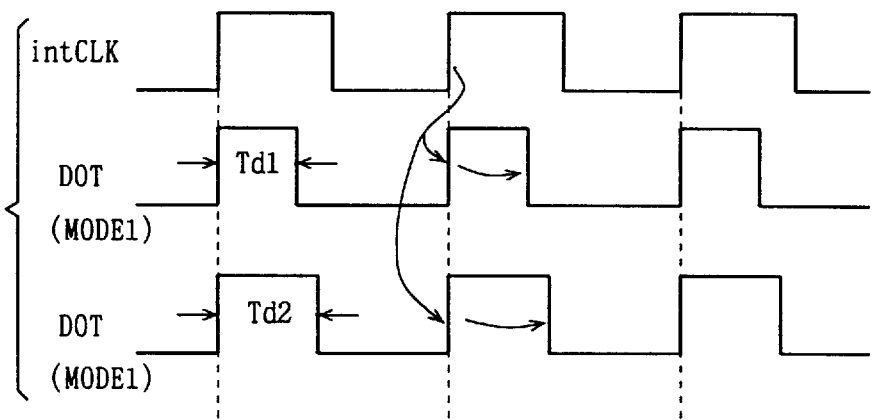

F I G. 8
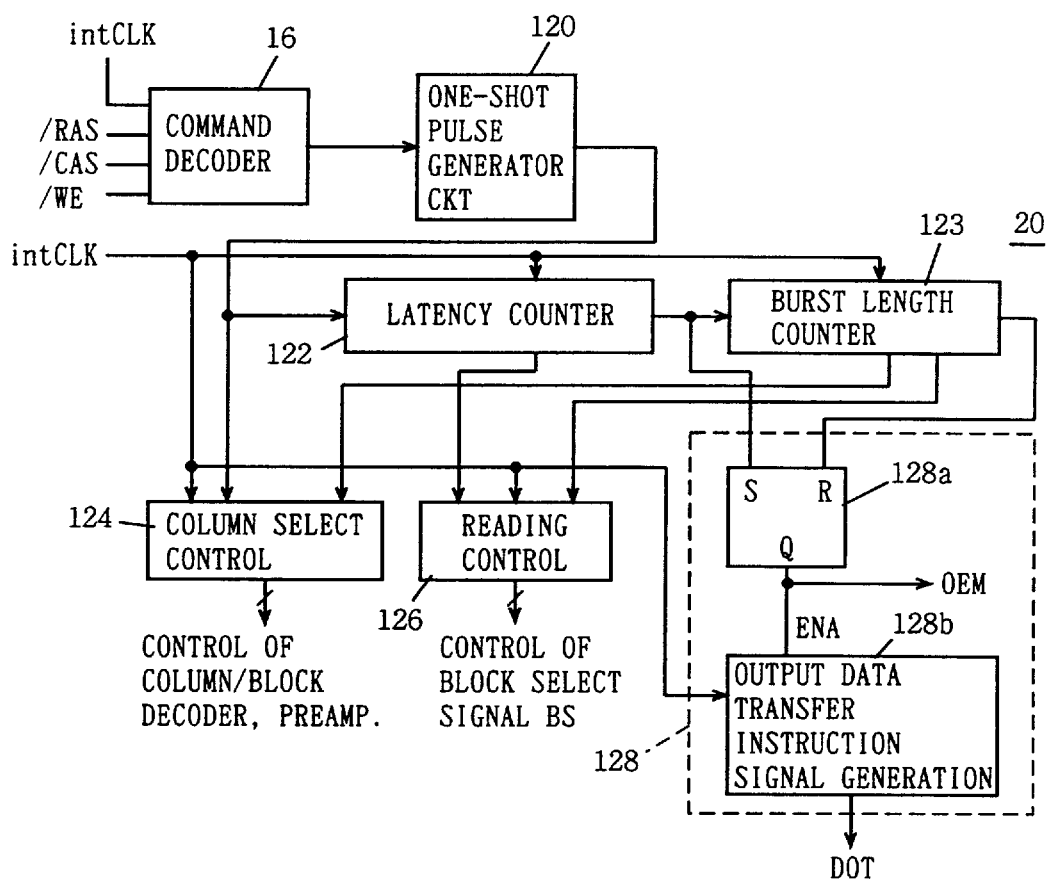

INTERNAL CLOCK GENERATING CIRCUIT FOR CLOCK SYNCHRONOUS TYPE SEMICONDUCTOR MEMORY DEVICE

BACKGROUND OF THE INVENTION

1. Field of the Invention

The present invention relates generally to synchronous type semiconductor memory devices for inputting/outputting data in synchronization with an externally applied clock signal having a prescribed pulse width, and more particularly, to the configuration of an internal clock generating circuit for generating an internal clock signal in synchronization with an externally applied clock signal.

2. Description of the Background Art

In recent years, microprocessors have come to operate at a speed as high as for example 100 MHz, or 200 MHz even. Meanwhile, dynamic type semiconductor memory devices (DRAM) used as a main memory have come to have an increased storage capacity and a higher operation speed. The operation speed of the dynamic type semiconductor memory device however cannot catch up with that of the microprocessor. During accessing the dynamic type semiconductor memory device, the microprocessor waits in a standby state until necessary data is collected, and therefore the operation speed of the dynamic type semiconductor memory device determines the system performance, which poses one stumbling block to improvement of the performance of the entire system.

In order to improve the system performance by reducing the gap in speed between the dynamic type semiconductor memory device and the microprocessor, a synchronous type semiconductor memory device inputting/outputting data in synchronization with a clock signal such as system clock signal has been used. The synchronous type semiconductor memory device incorporates an externally applied signal in synchronization with an externally applied clock signal, performs an internal operation to input/output data in synchronization with the clock signal. Since data is input/output in response to the clock signal, data transfer at a high speed is enabled. Furthermore, since the externally applied signal is incorporated in synchronization with the clock signal, it is not necessary to account for a margin for the skew of the externally applied signal, the internal operation start timing may be determined with reference to an edge of the clock signal, and therefore high speed accessing is permitted.

FIG. 13 is a diagram schematically showing the overall configuration of a conventional synchronous type semiconductor memory device. In FIG. 13, the synchronous type semiconductor memory device includes a memory cell array 1 having a plurality of memory cells arranged in rows and columns, an address buffer 2 incorporating an externally applied address signal AD in synchronization with an internal clock signal and generating an internal address signal, a row select circuit 4 which drives a row in memory cell array 1 addressed in response to an internal row address signal applied from address buffer 2 when activated, a column select circuit 6 which selects a corresponding column in memory cell array 1 in response to an internal column address signal applied from address buffer 2 when activated, a write/read circuit 8 which writes/reads internal data to/from a memory cell column selected by column select circuit 6, and an input/output circuit 10 which inputs/outputs data between write/read circuit 8 and the outside of the device. Memory cell array 1 includes one-transistor/one-capacitor type dynamic type memory cell. A word line is arranged corresponding to each row of memory cells, and a bit line pair is arranged corresponding to a column of memory cells.

Row select circuit 4 includes a row decode circuit which decodes an internal row address signal applied from address buffer 2 and a word line drive circuit which drives a word line arranged corresponding to a row addressed into a selected state in response to an output signal from the row decode circuit. Column select circuit 6 includes a column decode circuit which decodes an internal column address signal applied from address buffer 2 and generates a column select signal, and an IO gate which connects a selected column in memory cell array 1 to an internal data bus in response to a column select signal from the column decode circuit.

The synchronous type semiconductor memory device further includes a clock input buffer 12 which buffers an externally applied clock signal extCLK and generates an internal clock signal intCLK, an input buffer 14 which incorporates externally applied control signals /RAS, /CAS and /WE in synchronization with a rising of internal clock signal intCLK from clock input buffer 12, a command decoder 16 which determines the state of an internal control signal applied from input buffer 14 and generates an operation mode designation signal based on the result of determination, in synchronization with internal clock signal intCLK, a row related control circuit 18 which controls the operation of circuit portions related to row selection in response to an operation mode designation signal from command decoder 16, and a column related control circuit 20 which controls the operation of circuit portions related to column selection and data input/output in response to an operation mode designation signal from command decoder 16.

Signal /RAS is a row address strobe signal, signal /CAS a column address strobe signal, and signal /WE a write enable signal. Unlike a standard DRAM (Dynamic Random Access Memory), in the synchronous type semiconductor memory device, an operation mode is designated by a combination of states of these externally applied control signals /RAS, /CAS and /WE at the time of rising of the internal clock signals intCLK. Row related control circuit 18 operates in response to application of an active command which will be described later, and controls the operation of row select circuit 4, a sense amplifier and a bit line precharge/equalize circuit (now shown). Column related control circuit 20 is activated in response to application of a write command/read command indicating writing/reading of data, and controls the operation of column select circuit 6, write/read circuit 8 and input/output circuit 10 in synchronization with internal clock signal intCLK.

Clock input buffer 12 generates internal clock signal intCLK which synchronizes with external clock signal extCLK. Now, the operation of the synchronous type semiconductor memory device shown in FIG. 13 will be described in conjunction with the operation sequence chart in FIG. 14.

In clock cycle 1, row address strobe signal /RAS is set to an L level at a rising of external clock signal extCLK, and column address strobe signal /CAS and write enable signal /WE are set to an H level. The combination of the states of these external control signals is called "active command", and the command instructs driving of the internal state of the synchronous type semiconductor memory device into an active state. More specifically, when the active command is supplied, the synchronous type semiconductor memory device enters an active cycle, and starts an operation of selecting a memory cell row internally. When the active command is supplied, row related control circuit 18 is activated in response to a row select operation instruction signal from command decoder 16, and a corresponding row (word line) in memory cell array 1 is driven into a selected states by row select circuit 4. Data in a memory cell connected to the selected word line is sensed, amplified and latched by the sensor amplifier which is not shown. Row related control circuit 18 is instructed to activate the row related circuit portion in synchronization with internal clock signal intCLK, the circuit portion may be activated asynchronously in a prescribed sequence.

At the rising of external clock signal extCLK in clock cycle 3, row address strobe signal /RAS and write enable signal /WE are both set to an H level, and column address strobe signal /CAS is set to an L level. The combination of states of these external control signals /RAS, /CAS and /WE is called "read command", which designates a data read mode. When the read command is applied, column related control circuit 20 is activated in response to a read operation instruction signal from command decoder 16, and column select circuit 6, write/read circuit 8 and input/output circuit 10 operate in synchronization with internal clock signal intCLK in a prescribed sequence. More specifically, column select circuit 6 selects memory cell data in a column in memory cell array 1 addressed by an internal column address signal from address buffer 2 and applies the selected data to write/read circuit 8. Write/read circuit 8 applies internal read data applied through column select circuit 6 to input/output circuit 10. Input/output circuit 10 buffers thus applied internal read data and output the data as external data Q in synchronization with the clock signal.

The number of clock cycles necessary until valid data is output since application of a read command is called "CAS latency". FIG. 14 shows data reading when the CAS latency is 2 by way of illustration. At the rising of external clock signal extCLK in clock cycle 5, read data Q1 is defined and an externally provided processor samples read data Q1.

In the synchronous type semiconductor memory device, with an address signal (column address signal) applied simultaneously with the read command as a head address, address signals called burst address are sequentially generated inside, and a column selecting operation is performed in synchronization with the clock signal. The number of times the burst address is generated is determined by data called "burst length". Thereafter, data Q2, Q3 and Q4 are read in clock cycles 6, 7 and 8, respectively. In FIG. 14, the burst length is 4. More specifically, the burst length represents the number of pieces of data continuously read out or written when a single read or write command is supplied.

In clock cycle 8, at the rising of external clock signal extCLK, row address strobe signal /RAS and write enable signal /WE are both set to an L level, and column address strobe signal /CAS is set to an H level. The combination of the states is called "precharge command", which instructs the internal state of the synchronous type semiconductor memory device to be into a precharged state. In response to the precharge command, row related control circuit 18 brings a selected row in memory cell array 1 into a non-selected state in response to a precharge instruction signal from command decoder 16, and also drives the sense amplifier into an inactive state, and then bit line equalize/precharge circuit returns each column in memory cell array 1 to an intermediate potential level, precharge potential.

Row related control circuit 18 and column related control circuit 20 operate independently from each other. Column related control circuit 20 returns column select circuit 6, write/read circuit 8 and input/output circuit 10 all into a precharged state after the CAS latency and burst length time periods elapse. In FIG. 14, in clock cycle 8 in which the final data Q4 in the burst length data is read out, the precharge command is supplied, and therefore the internal circuit of the synchronous type semiconductor memory device returns to a precharge state in clock cycle 8 in response to application of the precharge command.

FIG. 15 is a diagram showing more in detail the configuration of column select circuit 6, write/read circuit 8 and input/output circuit 10 shown in FIG. 13. In FIG. 15, memory cell array 1 is divided into plurality of memory blocks (or banks) MB0 to MBm. In each of memory blocks (or banks) MB0 to MBm, sense amplifiers (SA) 1a0 to 1an are arranged corresponding to bit line pairs BLP0 to BLPn. Sense amplifiers (SA) 1a0 to 1an when activated sense, amplify and latch memory cell data on corresponding bit line pairs BLP0 to BLPn. Bit line pairs BLP0 to BLPn each include bit lines BL and /BL. Memory cell data is read out onto one of bit lines BL and /BL, and the other provides a reference potential to the memory cell data.

Column select circuit 6 includes a column/block decoder 6a activated under the control of column related control circuit 20 for decoding a column address signal and a block address signal applied through a signal path (now shown) and generating a column select signal to select a column addressed in a designated block, and IO gate circuits 6b0 to 6bn provided corresponding to memory cell blocks MB0 to MBn for selecting a bit line pair corresponding to a column addressed in a corresponding memory block in response to a column select signal from column/block decoder 6a.

IO gate circuit 6b0 to 6bn each include IO gates IG0 to IGn which receive column select signals CSL0 to CSLn from column/block decoder 6a at their gates. Column/block decoder 6a transfers a column select signal which attains an active state to only an IO gate circuit among IO gate circuits 6b0 to 6bn corresponding to a block addressed by a block address signal. In a single memory block, columns are sequentially selected according to burst addresses, and data for the burst length is read out. The burst address is an address generated by internally updating a column address sequentially for each clock cycle, with a column address at the time of application of a read command or a write command as a head address.

Write/read circuit 8 includes preamplifiers (PA) 8a to 8am provided corresponding to memory blocks MB0 to MBm and activated in response to a block designation signal from column/block decoder 6a and a preamplifier enable signal from column related control circuit 20, and tristate inverter buffers 8b0 to 8bm provided corresponding to preamplifiers 8a0 to 8am for transferring data applied from amplifiers (PA) 8a0 to 8am in response to block select signals BS0 to BSm from column related control circuit 20. Block select signals BS0 to BSm are generated in synchronization with internal clock signal intCLK during data reading. Preamplifiers (PA) 8a0 to 8am are activated when corresponding preamplifier enable signals PAE0 to PAEm are in an active state, and amplify internal read data DDF0 to DDFn read out from IO circuits 6b0 to 6bn in a corresponding memory block for transfer to input/output circuit 10. Tristate inverter buffers 8b0 to 8bm are activated when corresponding block select signals BS0 to BSm are in an active state, and each invert data applied from a corresponding preamplifier (PA) for transfer. When block select signal BS (BS0 to BSm) is in an inactive state, tristate inverter buffers 8b0 to 8bm attain an output high impedance state.

Input/output circuit 10 includes a transmission gate 10a which conducts in response to output data transfer instruction signals DOT and /DOT applied from column related control circuit 20 and transfers data applied from tristate inverter buffers 8b0 to 8bm, an inverter 10b which inverts the output signal of transmission gate 10a, an inverter 10c which inverts the output signal of inverter 10b for transfer to the input portion of inverter 10b, and an output buffer 10d which is activated when an output enable signal OEM from column related control circuit 20 is in an active state, buffers and externally outputs data applied from inverter 10b.

Output data transfer instruction signals DOT and /DOT are generated in synchronization with internal clock signal intCLK during data reading. Output enable signal OEM is brought into an active state after (CAS latency-1)cycles since a read command is given, and maintains the active state during a burst length time period. Now, the operation of the circuit shown in FIG. 15 will be described in conjunction with the timing charts in FIGS. 16 and 17.

Referring to FIG. 16, the data reading operation when the CAS latency is 3 will be described. In clock cycle #0, where an active command has already been supplied, in the synchronous type semiconductor memory device, an addressed row is driven into a selected state, sense amplifiers included in an address block have been activated, and data of memory cells connected to the selected world line has been sensed, amplified and latched.

In clock cycle #1, a read command is supplied. In synchronization with the rising of external clock signal extCLK in clock cycle #1, column select signal CSL (generically represented) from column/block decoder 6a is driven into a selected state. Thus, data in a memory cell corresponding to a column addressed by a column address signal applied simultaneously with the read command is applied to a corresponding preamplifier (PA) 8a (generically representing preamplifiers 8a0 to 8am) through IO gate circuit 6b (generically representing gate circuits 6b0 to 6bm). The transfer of data DDF from the IO gate circuit to the preamplifier requires almost 1 clock cycle. Therefore, the memory cell data read out by column select signal CSL(0) which has been activated in clock cycle #1 is defined in clock cycle #2. In clock cycle #2, the preamplifier performs an amplifying operation and latches the amplified data.

In clock cycle #2 block select signal BS (BS0 to BSm) from column related control circuit 20 is activated, data transferred from a corresponding preamplifier is amplified by tristate inverter buffer 8b (8b0 to 8bm) and applied to input/output circuit 10. Almost 1 clock cycle time period is necessary for data DD to reach input/output circuit 10 from tristate inverter buffer 8b. Therefore, memory cell data selected by tristate inverter buffer 8b in clock cycle #2 is defined in clock cycle #3 and applied to input/output circuit 10.

Then, in clock cycle #3, output data transfer instruction signal DOT is generated by column related control circuit 20. Data output transfer instruction signal DOT is brought into an H level active state during time period t1, which is triggered by the rising of external clock signal extCLK (internal clock signal intCLK). Thus, in input/output circuit 10 transmission gate 10a conducts, and data DD transferred from tristate inverter buffer 8b is applied to output buffer 10d. Output buffer 10d is brought into an active state in response to output enable signal OEM (which is applied from column related control circuit 20) in and after clock cycle #3, buffers and outputs data incorporated into transmission gate 10a as external data Q. According to output data transfer instruction signal DOT generated in clock cycle #3, output data Q is defined at the rising of external clock signal extCLK in clock cycle #4, and output data Q is sampled by an external processor or controller.

Thereafter, from clock cycle #3 to clock cycle #5, block select signal BS is generated taking advantage of a rising of external clock signal extCLK as a trigger, and data DD is generated based on selected memory cell data DDF and transferred to input/output circuit 10. Based on the transferred data DD, respective read data Q are defined sequentially in clock cycles #5, #6 and #7. Here, the burst length is set to 4.

During the operation when the CAS latency is 3, the minimum period of one cycle of external clock signal extCLK is 10 ns as will be described below. If column access time in the synchronous type semiconductor memory device (time required for valid data to be output after application of a read command) is tCAC, the minimum clock cycle period is given as tCAC/CAS latency. If, for example, tCAC=30 ns, the minimum clock cycle period for the CAS latency of 3 is 30 ns/3=10 ns. The column access time has its minimum value predetermined according to the characteristics of data transfer paths from sense amplifiers in the synchronous type semiconductor memory device. Therefore, for the minimum clock cycle of 10 ns, internal read data DD should be defined while output data transfer instruction signal DOT is at an H level (time width t1) in order to perform accurate data reading. Thus, if the time required for transferring data latched by a sense amplifier to input/output circuit 10 is within 2·clock cycle+t1=20 ns+t1, normal data reading can be performed by incorporating valid data DD in input/output circuit 10 (with transmission gate 10a conducting) in response to output data transfer instruction signal DOT. Herein, the time difference between the rising of output data transfer instruction signal DOT and the rising of external clock signal extCLK is ignored.

Now, referring to FIG. 17, the operation when the CAS latency is 2 will be described.

In clock cycle #0, an access command has already been supplied, the internal state of the synchronous type semiconductor memory device has been active, an addressed word line has been driven into a selected state, and data of a memory cell connected to the selected word line has been latched by a sense amplifier (SA).

In clock cycle #1, a read command is supplied. According to the read command, in clock cycle #1, column/block decoder 6a is activated under the control of column related control circuit 20, and column select signal CSL from column/block decoder 6a is driven into a selected state. If the CAS latency is 2, the clock cycle is relatively long, 15 ns for example, as will be described later. The memory cell data selected by column select signal CSL is therefore transferred to a corresponding preamplifier (PA) as valid data DDF in the same clock cycle #1.

If the CAS latency is 2, in clock cycle #1, block select signal BS (any of BS0 to BSm) is driven into a selected state. At the time, preamplifier (PA) has been necessarily driven into a selected state in response to preamplifier enable signal PAE and a block designation signal from column/block decoder 6a and has amplified memory cell data DDF. If block select signal BS attains an active state (H level), a corresponding tristate inverter buffer 8b is activated, amplifies and transfers data from a selected preamplifier to input/output circuit 10. The same time period as the case of the CAS latency of 3 is necessary for data DD to reach input/output circuit 10 from the activated tristate inverter buffer 8b, and therefore, data DD applied to input/output circuit 10 is defined in clock cycle #2.

In clock cycle #2, output data transfer instruction signal DOT is activated, in input/output circuit 10, transmission gate 10a conducts, incorporates data DD and outputs the data through output buffer 10d. Therefore, at the rising edge of external clock signal extCLK in clock cycle #3, data Q (Q) is defined.

In clock cycles #2 to #4, column select signal CSL is driven into a selected state in response to a burst address, then after data DDF in the selected memory cell is amplified by a preamplifier, the data is transferred to input/output circuit 10 as data DD through tristate inverter buffer 8b (8b0 to 8bm) according to block select signal BS (Bs0 to BSm). Memory cell data DDF selected in each of clock cycles #2 to #4 becomes valid data DD to input/output circuit 10 in clock cycles #3 to #5.

In clock cycles #2 to #5, output data transfer instruction signal DOT is active for a prescribed time period t1. Output data Q is therefore output according to valid data DD.

Let us assume that column access time tCAC in the synchronous semiconductor memory device is also 30 ns as is the case where the CAS latency is 3 as described above. Two clock cycles are necessary until valid data is output after application of a read command. Therefore, if the CAS latency is 2, the minimum clock cycle period is obtained as tCAC/CAS latency, i.e. 30 ns/2=15 ns. If therefore the time required for the transfer of internal data DDF and DD from the sense amplifier to input/output circuit 10 is within 1 clock cycle+t1=15 ns+t1=15 ns+t1, transmission gate 10a included in input/output circuit 10 can incorporate normal data and normally read the data.

FIG. 18A is a diagram showing the configuration of the portion generating output data transfer instruction signal DOT. The output data transfer instruction signal generation portion shown in FIG. 18A is included in column related control circuit 20 shown in FIG. 15. In FIG. 18A, the output data transfer instruction signal generation portion includes an odd number of stages (5 stages) of cascaded inverters 20a, 20b, 20c, 20d and 20e delaying internal clock signal intCLK by a prescribed time period and inverting the signal, an NAND circuit 20f receiving an output signal from inverter 20e, internal clock signal intCLK and a clock enable signal ENA, and an inverter 20g inverting the output signal of NAND circuit 20f. Inverter 20g outputs output data transfer instruction signal DOT.

Clock enable signal ENA determines a time period to generate output data transfer instruction signal DOT, and is generated based on burst length data and CAS latency data. The signal is activated during a clock cycle period determined by the burst length from the cycle preceding by 1 clock cycle the clock cycle of the CAS latency.

The operation of the output data transfer instruction signal generation portion in FIG. 18A will be described in conjunction with the operation waveform chart shown in FIG. 18B. In FIG. 18B, clock enable signal ENA is set to an H level active state.

When internal clock signal intCLK is at an L level, the output signal of NAND circuit 20f is at an H level, and output data transfer instruction signal DOT from inverter 20g is at an L level.

When internal clock signal intCLK rises to an H level, the output signal of inverter 20e is still at an H level, the output signal of NAND circuit 20f falls to an L level, and output data transfer instruction signal DOT output by inverter 20g rises to an H level accordingly. After the delay time periods by inverters 20a to 20e, the output signal of inverter 20e falls to an L level, and the output signal NAND circuit 20f rises to an H level accordingly. Thus, output data transfer instruction signal DOT from inverter 20g falls to an L level.

The output data transfer instruction signal generation portion is a one shot pulse generation circuit which generates a one shot pulse signal having a prescribed time width in synchronization with a rising of internal clock signal intCLK. The pulse width (H level time period) of output data transfer instruction signal DOT is determined by the delay time periods inverters 20a to 20e have. Output data transfer instruction signal DOT is driven in an H level active state only for a prescribed time period in synchronization with a rising of internal clock signal intCLK (or external clock signal extCLK), so that the output data incorporating timings may be surely set, and it is ensured that the next data will not be incorporated in a different falling timing due to noises on internal clock signal intCLK, thereby surely incorporating and latching normal data.

FIG. 19 is a timing chart for use in illustration of the relation between data DD applied to input/output circuit 10 and output data transfer instruction signal DOT. When a read command is applied in clock cycle #1, data transfer from the sense amplifier to the input/output circuit is initiated in this clock cycle #1. If the CAS latency is 3, data DD applied to input/output circuit 10 is defined in clock cycle #3. Data DD is transferred and latched by a latch formed of inverters through transmission gate 10a included in input/output circuit 10 when output data transfer instruction signal DOT is at an H level. Therefore, if the CAS latency is 3, data DD should be defined before the period of 2 clock cycles+t1 elapses. If data DD is defined after time T0 (when 2 clock cycles+t1 elapsed, while, the minimum clock cycle is 20 ns for the CAS latency of 3), thus defined data cannot be incorporated in clock cycle #3.

Meanwhile, if the CAS latency is 2, in clock cycle #2, output transfer instruction signal DOT rises. As denoted by a one-dotted chain line in FIG. 19, data DD should be defined before time T1 at which output data transfer instruction signal DOT falls. Therefore, if the CAS latency is 2, the time required for transferring the data latched by the sense amplifier to the input/output circuit should be 15 ns+t1. Herein, if the CAS latency is 2, the minimum clock cycle is 15 ns.

As shown in FIG. 18A, output data transfer instruction signal DOT is generated from the one shot pulse generation circuit. The pulse width t1 of output data transfer instruction signal DOT is constant independent of the value of the CAS latency. Therefore, if data latched by the sense amplifier is transferred to the input/output circuit through the same path in the same synchronous type semiconductor memory device, data should be transferred at a higher speed for the case of the CAS latency of 2 than the case of the CAS latency of 3. More specifically, the condition related to time required for transferring data latched by the sense amplifier to the input/output circuit is extremely hard for the case of the CAS latency of 2.

Furthermore, if the CAS latency is 2, how much margin is assured for transferring valid data should be tested, and in such testing, it is only determined whether normal data is read out simply by changing the operation frequency of external clock signal extCLK, which does not provide an accurate data read margin for the output data transfer instruction signal.

In addition, if the internal operation condition changes depending upon the operation mode not limited to data reading operation, the internal circuitry cannot be accurately operated using a clock signal having an optimum pulse width.

SUMMARY OF THE INVENTION

It is therefore an object of the present invention to provide a synchronous type semiconductor memory device from which normal data can be read out with a sufficient margin irrespective of the value of CAS latency.

Another object of the invention is to provide a synchronous type semiconductor memory device which permits readily determining about how much margin is secured for an output data transfer instruction signal during data reading.

Yet another object of the present invention is to provide a synchronous type semiconductor memory device from which data can be correctly read out irrespective of operation environments.

The synchronous type semiconductor memory device according to the present invention includes an internal clock generating portion for generating an internal clock signal from an externally applied clock signal, and a pulse width setting portion coupled to the internal clock generating portion for setting the pulse width of the internal clock signal according to an operation mode specifying signal to specify a single operation mode among a plurality of operation modes.

The internal circuit may be operated in response to a clock signal having an optimum pulse width by adjusting the pulse width of the internal clock signal depending upon the operation mode.

The time period to incorporate internal data by the input/output circuit may be adjusted for different CAS latencies, internal data may be incorporated with a margin, and accurate data reading may be performed.

In addition, if the pulse width of the internal clock signal is adjusted in a test operation mode, the margin for incorporating data secured for the internal clock signal having a prescribed pulse width may be measured, and therefore the practical performance of the synchronous semiconductor memory device may be accurately determined.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram schematically showing the configuration of an output data transfer instruction signal generation circuit according to a first embodiment of the present invention;

FIG. 2 is a signal waveform chart for use in illustration of the operation of the circuit shown in FIG. 1;

FIG. 8 is a diagram schematically showing the configuration of an internal control signal generation portion according to a third embodiment of the invention;

DESCRIPTION OF THE PREFERRED EMBODIMENTS

First Embodiment

Figure 3:
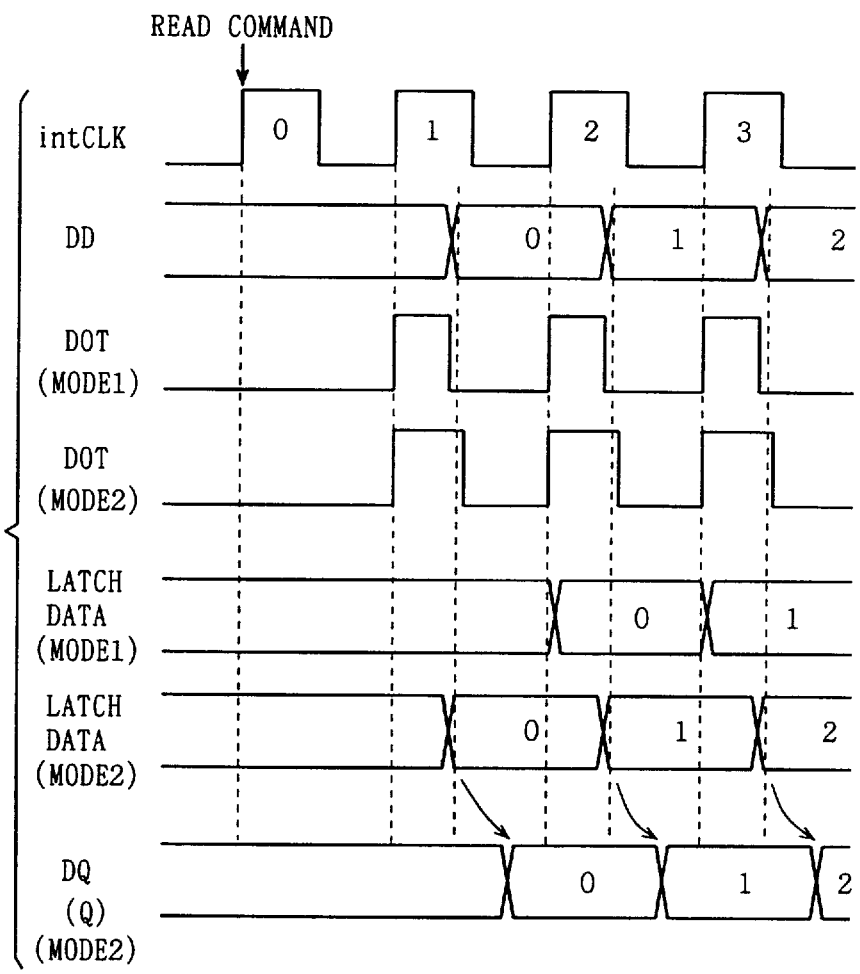
FIG. 3 is a waveform chart for use in illustration of a data reading operation using the read operation transfer instruction signal generation circuit in FIG. 1.

FIG. 1 is a diagram showing the configuration of a main portion of a synchronous type semiconductor memory device according to a first embodiment of the invention. In FIG. 1, only the portion to generate output data transfer instruction signal DOT is illustrated. The other configuration is the same as that shown in FIGS. 13 and 15. In FIG. 1, the output data transfer instruction signal generation portion includes a delay circuit 20p which delays internal clock signal intCLK by delay time Td1, a tristate inverter buffer 20q which becomes operative while a mode instruction signal MODE1 is activated and inverts a signal from delay circuit 20p for output, a delay circuit 20r which delays internal clock signal intCLK by delay time Td2, a tristate inverter buffer 20s which becomes operative while a mode instruction signal MODE2 is activated and inverts an output signal from delay circuit 20r for output, a 3-input NAND circuit 20f which receives clock enable signal ENA, internal clock signal intCLK and an output signal from one of tristate inverter buffers 20q and 20s, and an inverter 20g which inverts an output signal from NAND circuit 20f and outputs output data transfer instruction signal DOT.

Tristate inverter buffers 20q and 20s attain an output high impedance state in a non-active state. The delay time Td2 of delay circuit 20r is longer than the delay time Td1 of delay circuit 20p. Now, the operation of the output data transfer instruction signal generation portion shown in FIG. 1 will be described in conjunction with the waveform chart in FIG. 2.

One of operation mode instruction signals MODE1 and MODE2 is activated, and the other is brought to an inactive state. If operation mode instruction signal MODE1 is activated, tristate inverter buffer 20q operates as an inverter, and tristate inverter buffer 20s is set to an output high impedance state. In this state, output data transfer instruction signal DOT attains an H level during the delay time Td1 of delay circuit 20p in synchronization with the rising of internal clock signal intCLK. Herein, it is assumed that clock enable signal ENA is in an active H level.

Meanwhile, if operation mode instruction signal MODE2 is activated, output transfer instruction signal DOT attains an H level during the delay time Td2 of delay circuit 20r in synchronization with the rising of internal clock signal int CLK. If operation mode instruction signals MODE1 and MODE2 are set according to the CAS latency, the pulse width of output data transfer instruction signal DOT may be set to an optimum value and accurate data may be incorporated to the input/output circuit as will be described later.

FIG. 3 is a waveform chart showing the timing relation between data DD applied to the input/output circuit and output data transfer instruction signal DOT. The data reading path shown in FIG. 3 is the same as the data reading path shown in FIG. 15. In FIG. 3, the operation where the CAS latency is set to 2 is illustrated.

In clock cycle 0, a read command is supplied. If the CAS latency is 2, in the next clock cycle 1, the data of a selected memory cell (sense amplifier) is transferred. Output data transfer instruction signal DOT is in an H level for a prescribed time period in synchronization with the rising of internal clock signal intCLK. In this period in which output data transfer instruction signal DOT is in an H level, data DD is incorporated. If the rising timing of output data transfer instruction signal DOT is earlier than the timing in which data DD is defined while operation mode instruction signal MODE1 is in an active state, the input/output circuit cannot incorporate the data in each clock cycle. If operation mode instruction signal MODE1 is set and output data transfer instruction signal DOT is brought into an inactive state before valid data DD is transferred, data (0) transferred in clock cycle 1 is incorporated and latched in the next clock cycle 2. Thus, the valid data will be externally output in clock cycle 2. Under this operation condition, the CAS latency is 3, and data cannot be read out in the condition of the CAS latency of 2.

When data cannot be accurately read out as operation mode instruction signal MODE is activated, operation mode instruction signal MODE2 is activated. Under this condition, the pulse width of output data transfer instruction signal DOT is increased (Td2), so that output data transfer instruction signal DOT is still in an H level when valid data DD reaches, thus permitting the valid data to be incorporated into input/output circuit 10. Therefore, in each clock cycle, the valid data may be incorporated and latched into input/output circuit 10 and output through output buffer 10b. The data can be accurately read out even if the CAS latency is 2. Therefore, setting the pulse width of the output data transfer instruction signal depending upon the operation situations, data can be read out accurately, and a highly reliable synchronous semiconductor memory device may be implemented as a result.

Figure 4:
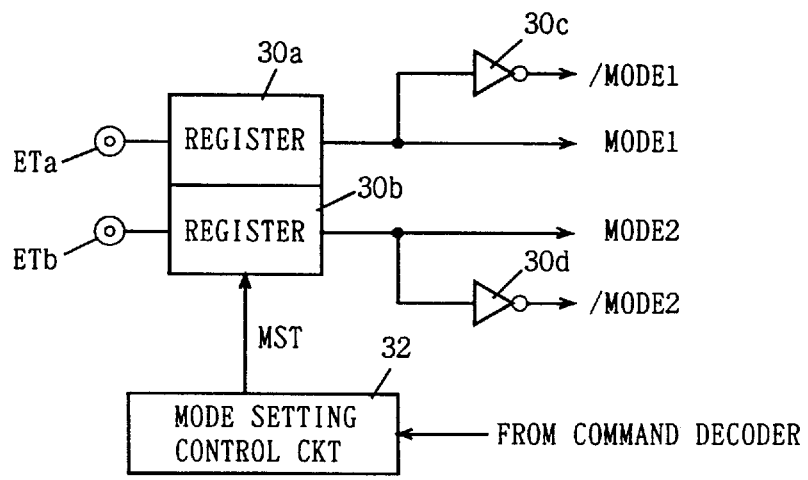
FIG. 4 is a diagram schematically showing the configuration of the operation mode instruction signal generation portion in FIG. 1.

FIG. 4 is a diagram schematically showing the configuration of the operation mode instruction signal generation portion. In FIG. 4, the operation mode instruction signal generation portion includes registers 30a and 30b for storing data applied to external terminals ETa and ETb, an inverter 30c which inverts data stored in register 30a, an inverter 30d which inverts data stored in register 30b, and a mode setting control circuit 32 activated in response to an operation mode setting cycle instruction received from the command decoder for driving operation mode setting instruction signal MST to an active state.

Operation mode instruction signals MODE1 and /MODE1 are output from register 30a and inverter 30c. Operation mode instruction signals MODE2 and /MODE2 are output from register 30b and inverter 30d, respectively. Registers 30a and 30b incorporate and latch signals applied on external terminals ETa and ETb when the operation mode setting instruction signal from mode setting control circuit 32 is in an active state. When operation mode setting instruction signal MST is inactivated, registers 30a and 30b latch the stored data. External terminals ETa and ETb may be data input terminals or address signal input terminals.

Figure 5:
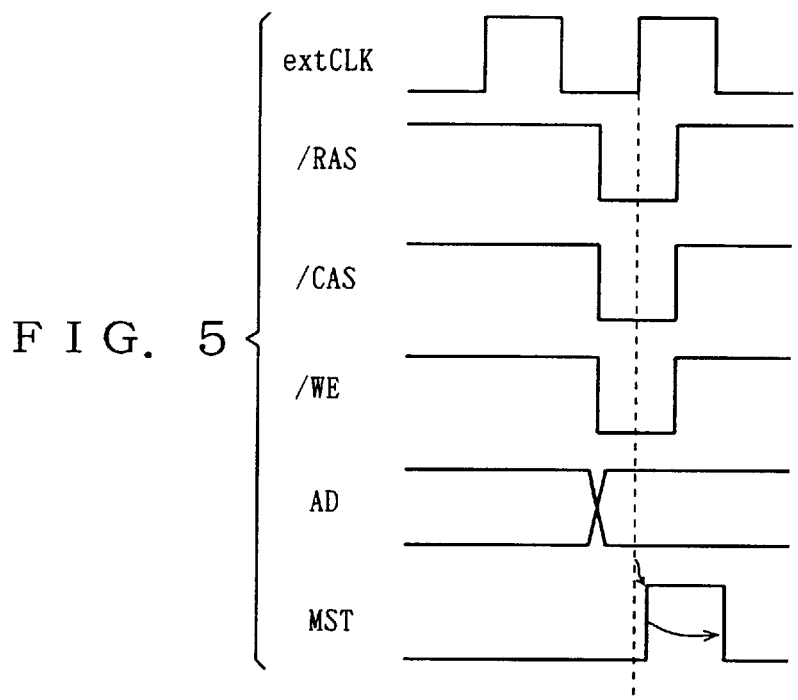
FIG. 5 is a timing chart showing externally applied control signals to give a mode setting instruction shown in FIG. 4.

FIG. 5 is a chart for use in illustration of the timings of external control signals to set the operation mode instruction signal. In FIG. 5, at a rising edge of external clock signal extCLK, row address strobe signal /RAS, column address strobe signal /CAS and write enable signal /WE are all set to an L level, and a particular bit of an address signal AD is set to a prescribed value. Under this condition, an operation mode instruction signal setting cycle is specified, and mode setting control circuit 32 drives operation mode setting instruction signal MST having a prescribed time width to an active state according to the operation mode setting cycle instruction from the command decoder. Mode setting control circuit 32 needs only be a simple one-shot pulse generation circuit.

Variation

Figure 6:
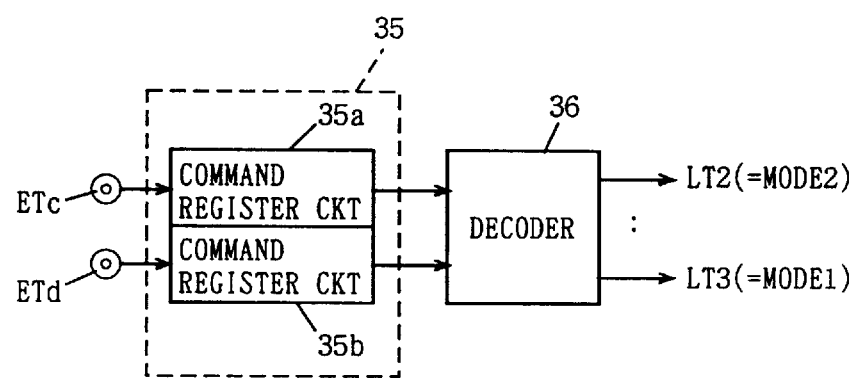
FIG. 6 is a diagram showing another configuration of the operation mode instruction signal generation portion shown in FIG. 1.

FIG. 6 is a diagram schematically showing the configuration of a variation of the operation mode instruction signal generation portion. In FIG. 6, the operation mode instruction signal generation portion includes a command register 35 activated in response to a command register set instruction from the command decoder for storing data applied to external terminals ETc and ETd, and a decoder 36 which decodes data stored in command register 35 and outputs CAS latency instruction signals LT2, LT3, . . . CAS latency instruction signal LT2 indicates that the CAS latency is 2 when activated, while CAS latency instruction signal LT3 indicates that the CAS latency is 3 when activated.

Command register 35 includes command register circuits 35a and 35b provided corresponding to external terminals ETc and ETd, respectively, for incorporating and latching data from corresponding external terminals. Decoder 36 is used, because the CAS latency can be set to a value such as 1, 2, 3 and 4, and decoding 2-bit CAS latency instruction information reduces the number of command register circuits necessary for the CAS latency instruction.

Command register 35 and decoder 36 are provided in a usual synchronous type semiconductor memory device, and the command register set mode is set by the timing condition shown in FIG. 5. CAS latency instruction signal LT2 is used as operation mode instruction signal MODE2, and CAS latency instruction signal LT3 is used as operation mode instruction signal MODE1. The use of the CAS latency instruction signal as the operation mode instruction signal eliminates the necessity of the operation mode instruction signal generation portion, and the area occupied by the device may be kept from increasing.

As described above, according to the first embodiment of the invention, since the pulse width of the output data transfer instruction signal is adjusted according to CAS latency information, the pulse width of output data instruction signal DOT may be set to an optimum value irrespective of the value of CAS latency, and accurate data reading may be performed.

Second Embodiment

Figure 7:
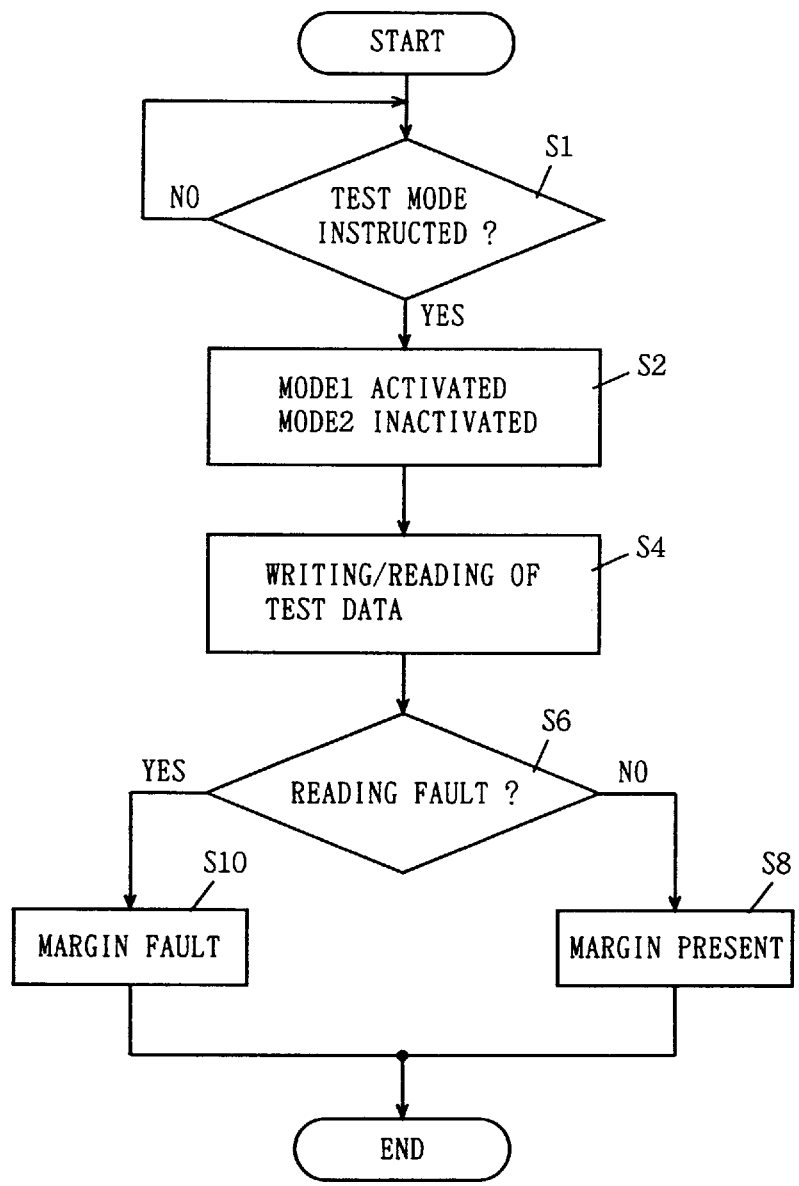
FIG. 7 is a flow chart for use in illustration of the operation of a synchronous type semiconductor memory device according to a second embodiment of the invention.

FIG. 7 is a flow chart for use in illustration of a test operation for a synchronous type semiconductor memory device according to a second embodiment of the invention. In the second embodiment, the output data transfer instruction signal generation portion shown in FIG. 1 is used. Irrespective of the value of the CAS latency, in the normal operation mode, operation mode instruction signal MODE2 is activated, and operation mode instruction signal MODE1 is inactivated. Therefore, the delay time of delay circuit 20r shown in FIG. 1 determines the pulse width of the output data transfer instruction signal. The second embodiment will be described in conjunction with FIG. 7.

First, it is determined if a test mode instruction is received (step S1). The test mode instruction is specified by setting a particular bit of address signal AD to a prescribed value in the timing relation shown in FIG. 5. If the test mode is designated, operation mode instruction signal MODE1 is activated, and operation mode instruction signal MODE2 is inactivated (step S2). Thus, the pulse width of output data transfer instruction signal DOT becomes shorter than that in the normal operation mode.

In this state, test data is written into the synchronous type semiconductor memory device, and then the written data is read out (step S4). During reading out the test data, an output data transfer instruction signal having a shorter pulse width than that in the normal operation mode is used.

Then, the read out data is compared to an expected value data (written test data), and it is determined if their logics match (step S6). If the read out data matches the expected value data, it shows that accurate reading has been conducted, and it is determined that the pulse width of output data transfer instruction signal DOT has an enough margin (step S8). On the other hand, if the read out data does not match the expected value data, it is determined that data has not been accurately incorporated or latched in the input/output circuit, and that the margin of the output data transfer instruction signal is poor (step S10).

By the series of test operations, it can be readily identified if the pulse width of the output data transfer instruction signal DOT used during normal operation has an enough margin. Furthermore, during a normal test operation if a fault occurs, it can be readily identified if the cause of the fault is the poor margin of the output data transfer instruction signal.

Note that in the above description of the second embodiment, irrespective of the CAS latency, the pulse width of the output data transfer instruction signal is constant. However, the first embodiment and second embodiments may be used in combination. More specifically, the pulse width of output data transfer instruction signal DOT may be set depending upon the CAS latency, a delay circuit providing a delay shorter by a prescribed margin and a pulse generation portion for measuring the margin are provided for each pulse width. Thus, it can be accurately identified if a margin required for each CAS latency exists.

As described above, according to the second embodiment, in the test mode operation mode, the pulse width of the output data transfer instruction signal is adjusted, the margin of the pulse width of output data transfer instruction signal can be readily identified, the margin failure determination may be readily performed, and the reliability of the synchronous type semiconductor memory device may be improved.

Third Embodiment

Figure 13:
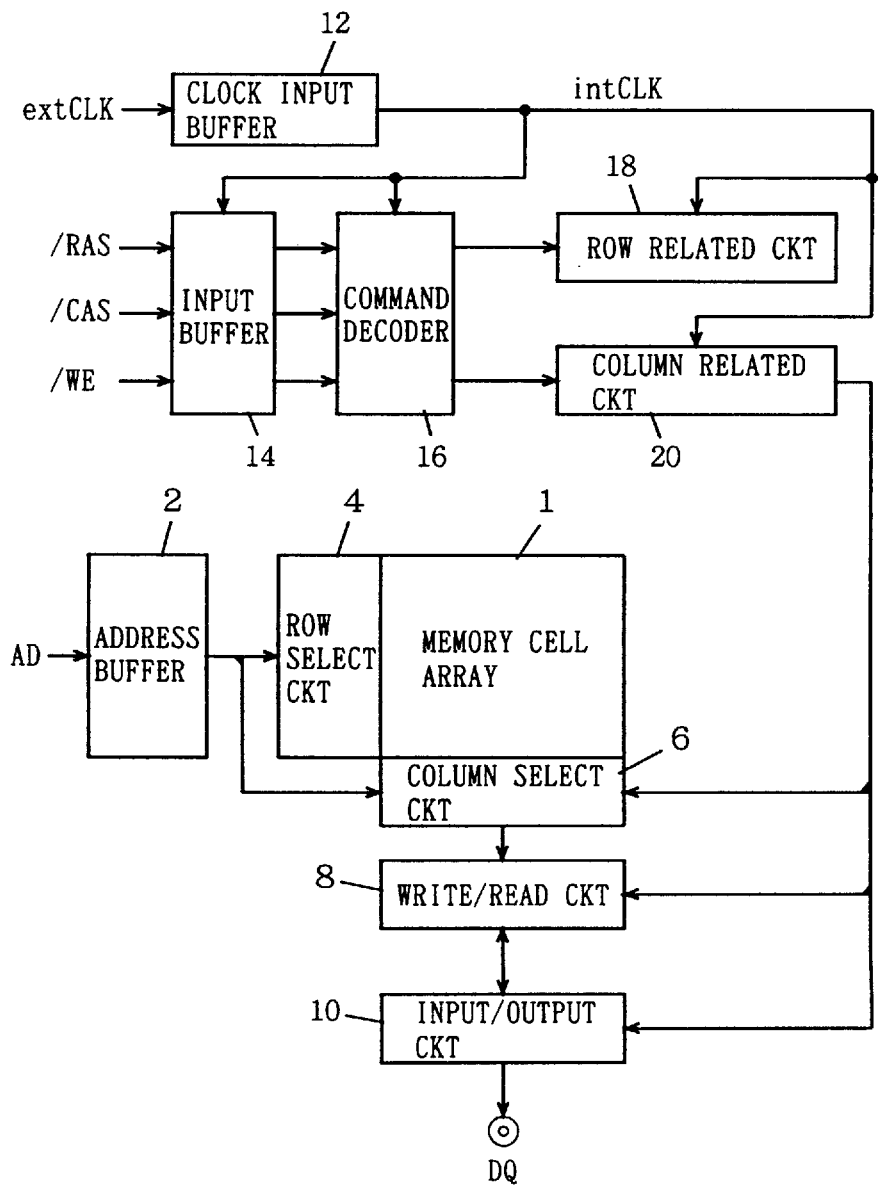
FIG. 13 is a diagram schematically showing the overall configuration of a conventional synchronous type semiconductor memory device.
Figure 14:
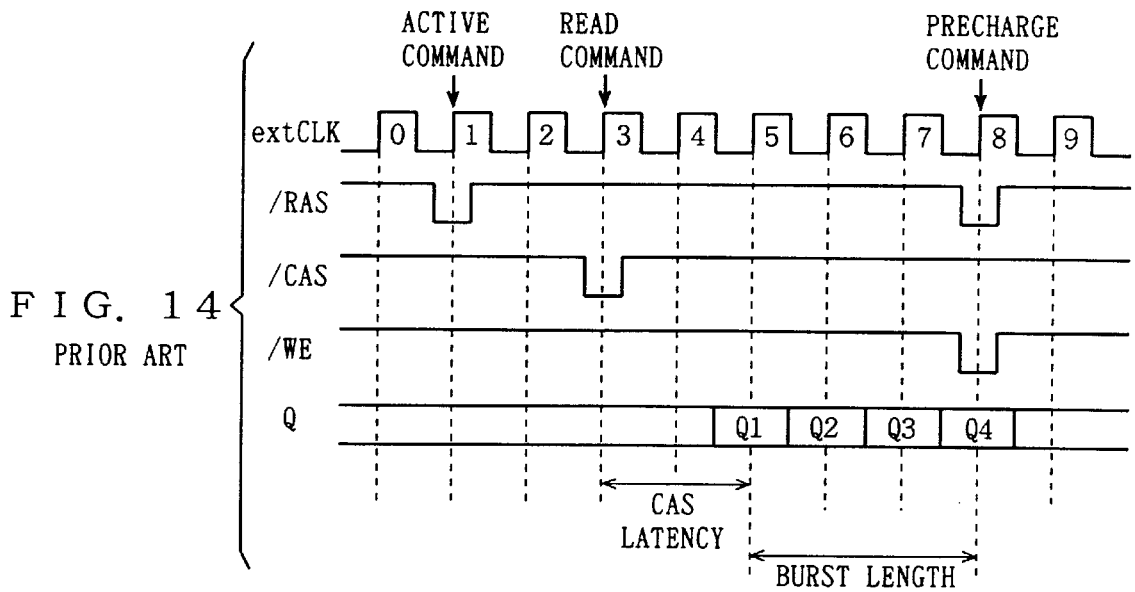
FIG. 14 is a timing chart for use in illustration of the operation of the synchronous type semiconductor memory device shown in FIG. 13.

FIG. 8 is a diagram schematically showing the configuration of a column related control circuit to control the column select circuit, reading circuit and input/output circuit shown in FIG. 13. In FIG. 8, column related control circuit 20 includes a one shot pulse generation circuit 120 which generates a one shot pulse signal having a prescribed width in response to a reading operation instruction signal from command decoder 16, a latency counter 122 which is activated in response to a one shot pulse from one shot pulse generation circuit 120 and counts a latency period according to internal clock signal intCLK, a burst length counter 123 which is activated in response to a count up signal from latency counter 122 and counts a burst length period according to internal clock signal intCLK, a column select control circuit 124 which is activated in response to a one shot pulse from one shot pulse generation circuit 120 and inactivated in response to a prescribed output from burst length counter 123 and performs operation related to column selection while it is activated, a reading control circuit 126 which is activated in response to a prescribed output signal from latency counter 122 and inactivated in response to a prescribed output signal from burst length counter 123 and controls the generation of block select signal BS when activated, and an output control circuit 128 which is activated in response to a count up signal from latency counter 122 and inactivated in response to a count up signal from burst length counter 123 and generates output enable signal OEM and output data transfer instruction signal DOT when activated.

Figure 15:
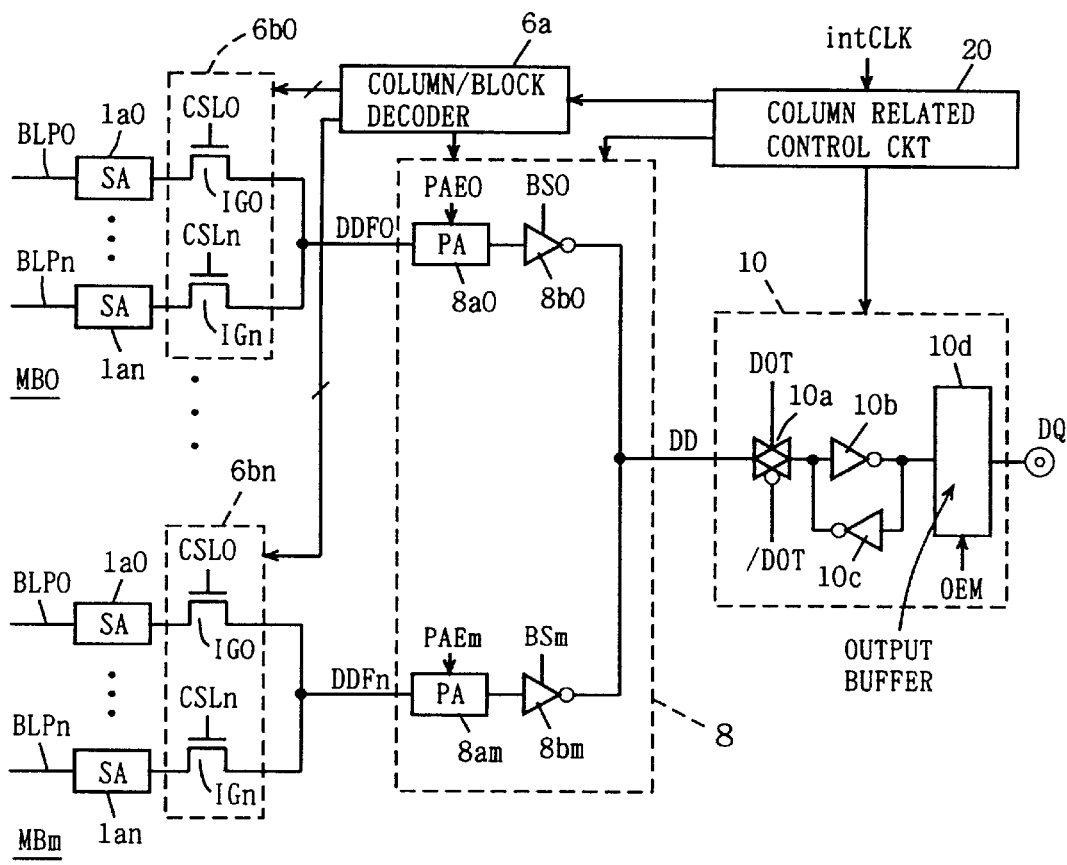
FIG. 15 is a diagram schematically showing the configuration of a data reading portion in a conventional synchronous type semiconductor memory device.
Figure 16:
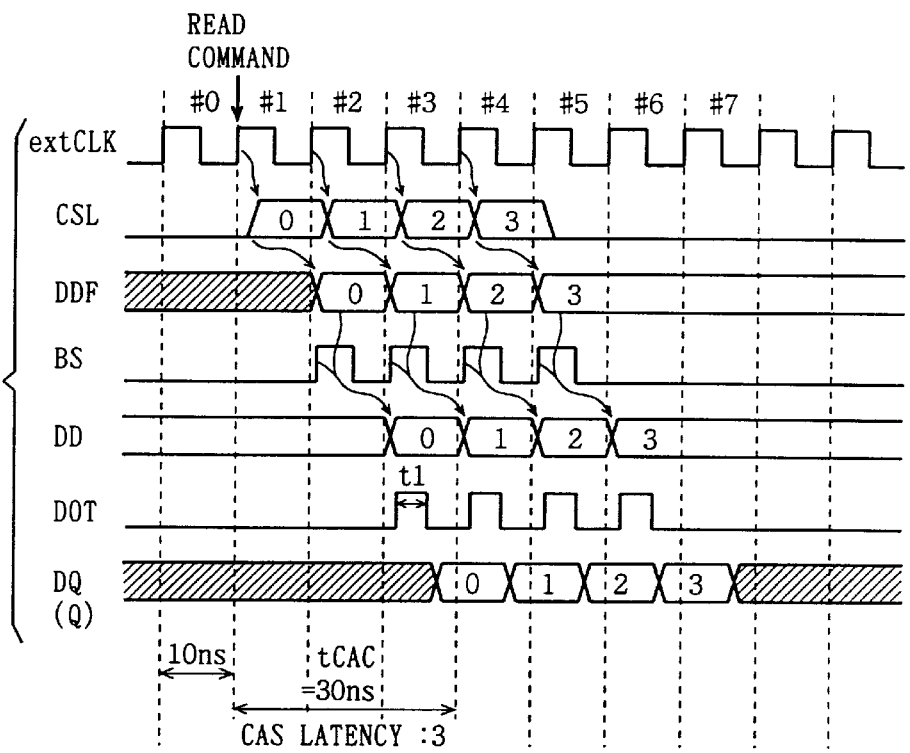
FIG. 16 is a timing chart for use in illustration of the operation of the data reading portion shown in FIG. 15.
Figure 17:
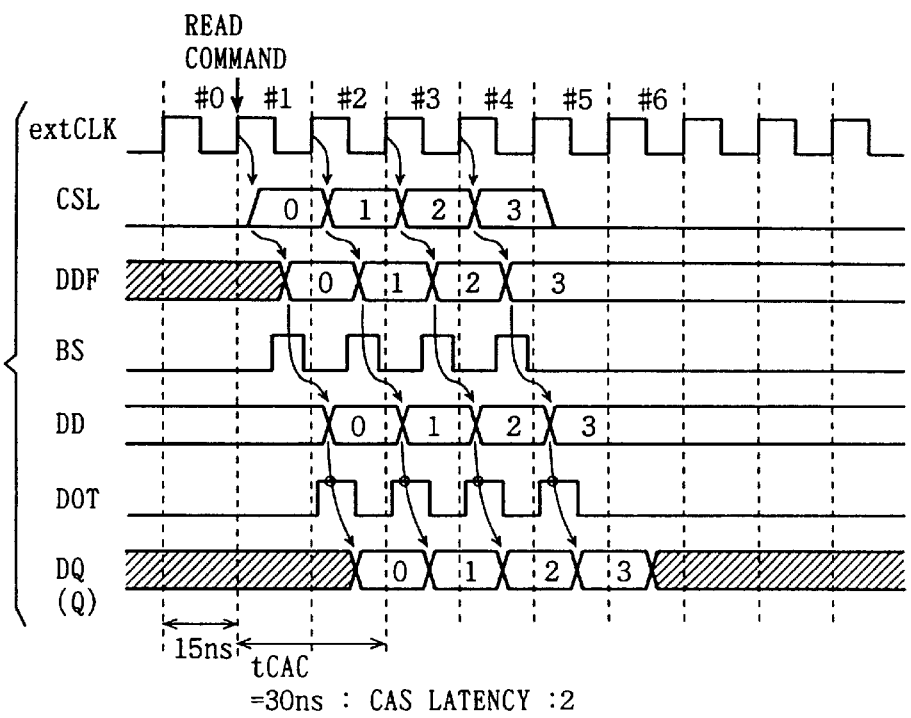
FIG. 17 is a timing chart for use in illustration of the operation of the data reading portion shown in FIG. 15.
Figure 18A:
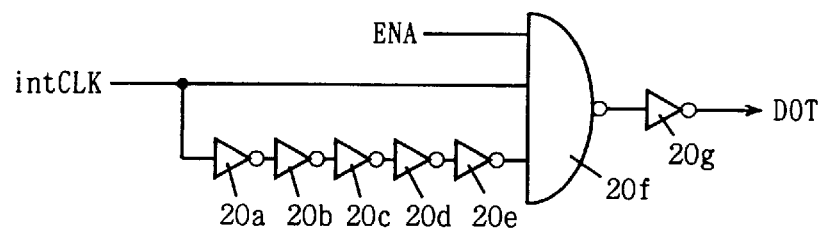
FIG. 18A shows the configuration of a conventional output data transfer instruction signal generation circuit.
Figure 18B:
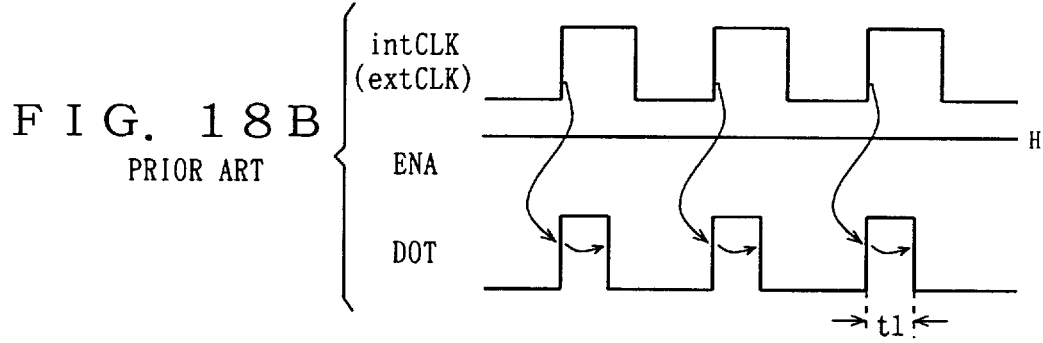
FIG. 18B is a waveform chart representing the operation of the circuit shown in FIG. 18A.
Figure 19:
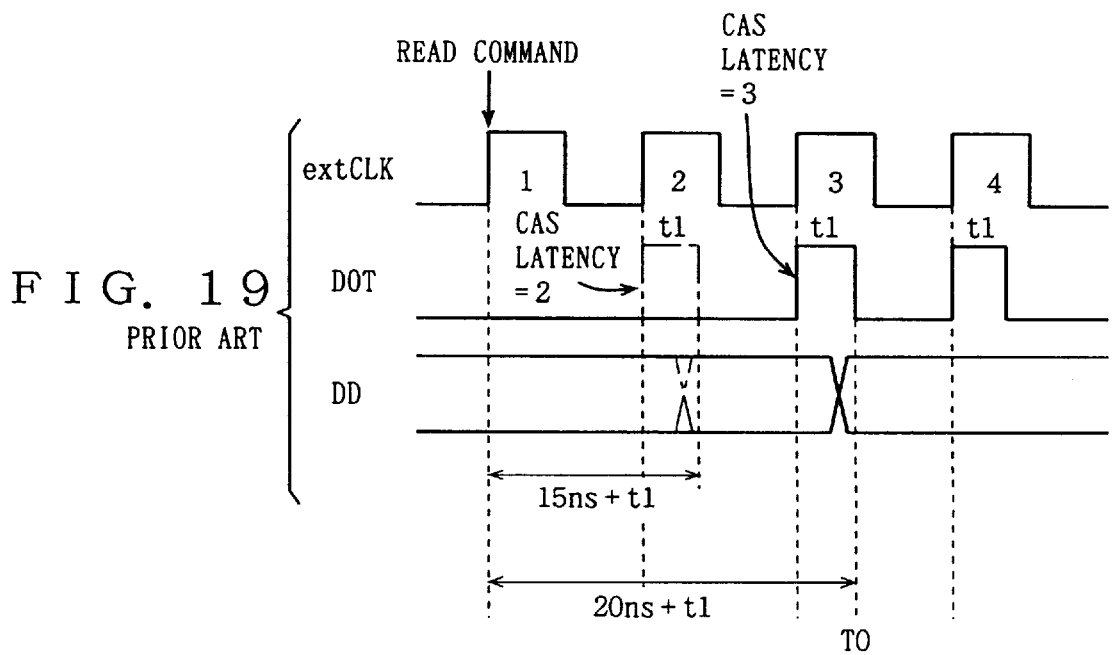
FIG. 19 is a chart illustrating problems associated with a conventional synchronous type semiconductor memory device.

Column select control circuit 124 provides a timing to control the activation of the column/block decoder and preamplifier shown in FIG. 15. Under the control of select control circuit 124, the column/block decoder performs a decoding operation in synchronization with an externally applied clock signal, while the preamplifier is activated in response to an internal clock signal according to a block instruction signal.

Reading control circuit 126 controls the generation of block select signal BS to transfer data amplified by the preamplifier. Reading control circuit 126 outputs block select signal BS in synchronization with internal clock signal intCLK. If the block select signal also selects a memory block (when a tristate inverter buffer is provided corresponding to each preamplifier), reading control circuit 126 activates the tristate buffer in synchronization with the internal clock signal according to the memory block designation signal.

Output control circuit 128 includes a set/reset flipflop 128a which is set in response to a count up signal from latency counter 122 and a count up signal from burst length counter 123, and an output data transfer instruction signal generation circuit 128b which outputs output data transfer instruction signal DOT according to clock enable signal ENA from set/reset flipflop 128a and internal clock signal intCLK. Set/reset flipflop 128a also outputs output enable signal OEM in synchronization with clock enable signal ENA. Now, the activation timing for column related control circuit 20 shown in FIG. 8 will be described in conjunction with the timing chart in FIG. 10.

Figure 10:
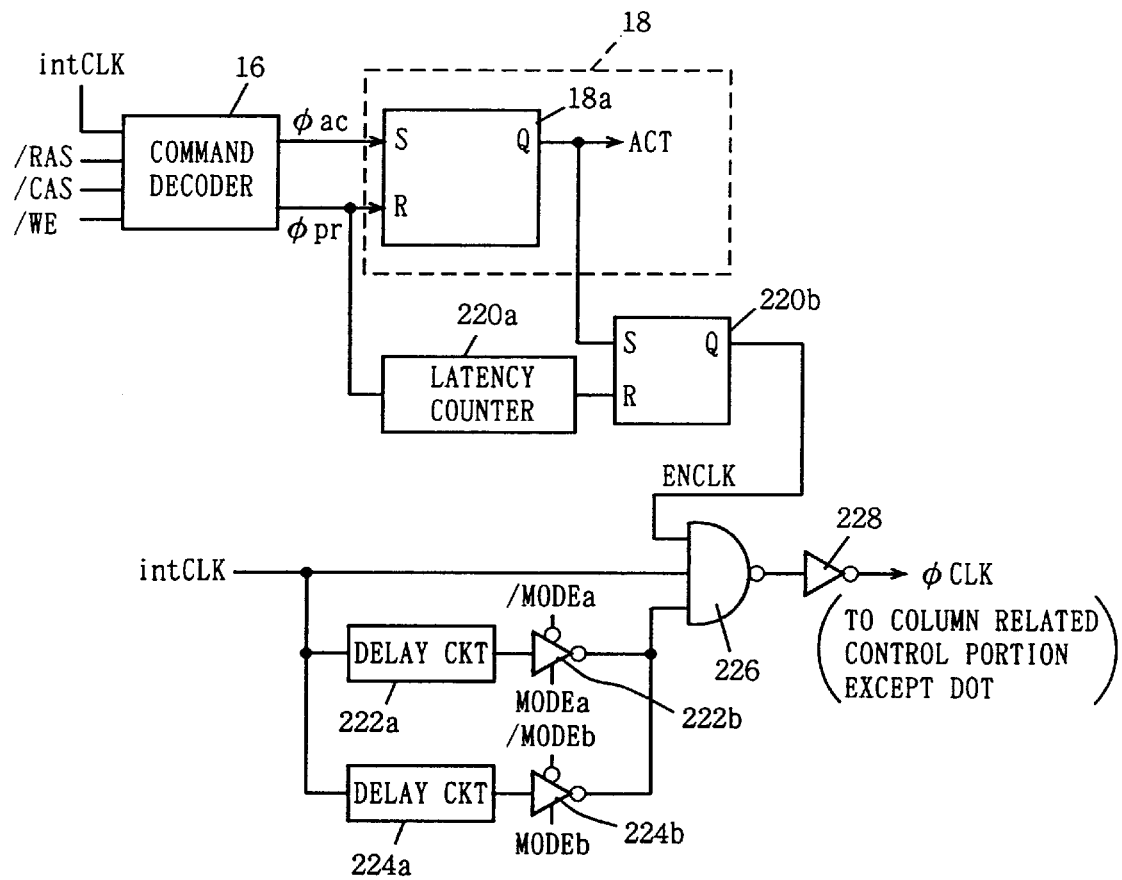
FIG. 10 is a diagram schematically showing the configuration of an internal clock generation circuit according to the third embodiment of the invention.

In FIG. 10, a read command is supplied in clock cycle 0. Column select control circuit 124 is activated in response to a one shot pulse from one shot pulse generation circuit 120 in clock cycle 0 according to the read command. The time period of this active state is determined by a prescribed output from burst length counter 123. Column select control circuit 124 is provided with a signal which is active during the burst length period after a reading operation instruction signal is applied to burst length counter 123.

Figure 9:
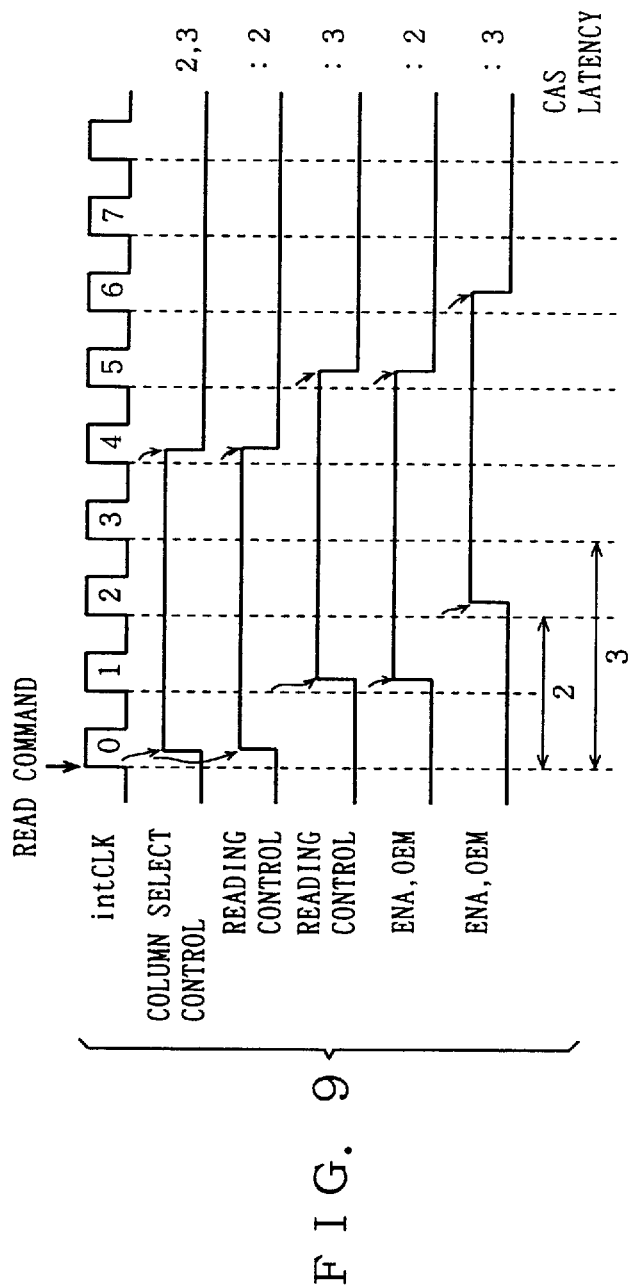
FIG. 9 is a timing chart for use in illustration of the operation of the circuit shown in FIG. 8.

Herein, latency counter 122 and burst length counter 123 are formed of shift registers, a one shot pulse from one shot pulse generation circuit 120 is transferred by latency counter 122 in synchronization with internal clock signal intCLK, and burst length counter 123 transfers a count up signal from latency counter 122 in synchronization with internal clock signal intCLK. Therefore, a necessary activation signal may be extracted by selecting the output of a prescribed register stage of each of latency counter 122 and burst length counter 123. The count up signal of latency counter 122 is changed into an active state in a clock cycle before the clock cycle specified by the latency. Therefore, column select control circuit 124 as shown in FIG. 9 is brought into an active state during the period from clock cycle 0 in which the read command is supplied and to clock cycle 3 in which burst length period passes, and in clock cycle 4, the circuit is inactivated. Reading control circuit 126 has its activation initiation timing determined by latency counter 122, and its inactivation initiation timing determined by burst length counter 123. Reading control circuit 126 is activated in a cycle preceding by two clock cycles the clock cycle defined by the CAS latency. Therefore, if the CAS latency is 2, reading control circuit 126 is activated in clock cycle 0 in which the read command is supplied, and if the CAS latency is 3, reading control circuit 126 is activated in clock cycle 1.

Reading control circuit 126 is inactivated in the clock cycle in which the final data of the burst length data is output. Therefore, an output signal advancing by one stage the final count up signal of burst length counter 123 is selected and applied to reading control circuit 126. More specifically, if the CAS latency is 2, reading control circuit 126 is activated during the period from clock cycle 0 to clock cycle 3, and is again inactivated in clock cycle 4. If the CAS latency is 3, reading control circuit 126 is activated in clock cycle 1, maintains its active state until clock cycle 4, and inactivated in clock cycle 5.

Output control circuit 128 is activated and inactivated according to the count up signals of latency counter 122 and burst length counter 126. Clock enable signal ENA and output enable signal OEM are activated in clock cycle 1 if the CAS latency is 2, maintains their active states until clock cycle 4, and inactivated in clock cycle 5. If the CAS latency is 3, these signals ENA and OEM maintain their active states from clock cycle 2 to clock cycle 5, and inactivated in clock cycle 6.

In column related control circuit 20, all the operations are in synchronization with internal clock signal intCLK. More specifically, the activation timings of internal clock signals are determined taking advantage of internal clock signal intCLK as a trigger. Herein, in the portions related to data transfer from sense amplifiers to the input/output circuit in column select control circuit 12, and reading control circuit 126, internal control signals are generated in synchronization with internal clock signal intCLK. Therefore, during the transfer operation, using a one shot pulse generation circuit identical to that shown in FIG. 1 permits accurate data transfer, and accurate data transfer and latching are permitted depending upon operation environments.

FIG. 10 is a diagram schematically showing the configuration of an internal clock generation portion according to the third embodiment of the invention. In FIG. 10, a row related control circuit 18 includes a set/reset flipflop 18a which is set in response to the activation of an active operation instruction signal ωac from command decoder 16 and reset in response to the activation of a precharge operation instruction signal ωpr. Set/reset flipflop 18a outputs a row related circuit activation signal ACT. When row related circuit activation signal ACT is in an active state, bit line precharging/equalizing is stopped, a word line is selected and a sense amplifier is activated in a prescribed sequence. Active operation instruction signal ωac is activated in a one shot pulse form in response to application of an active command, while precharge operation instruction signal ωpr is activated in the form of one shot pulse in response to application of a precharge command.

The internal clock generation portion includes a latency counter 220a which delays precharge operation instruction signal ωpr by clock cycle periods specified by the CAS latency, and a set/reset flipflop 220b set in response to the activation of row related circuit activation signal ACT and reset in response to the activation of output signal from latency counter 220a. Set/reset flipflop 220b outputs a clock enable signal ENCLK.

The internal clock generation portion includes a delay circuit 222a which delays internal clock signal intCLK by a prescribed time period, a tristate inverter buffer 222b which is brought into an operative state during the activation of operation mode instruction signal MODEa and inverts the output signal of delay circuit 222a, a delay circuit 224a which delays internal clock signal intCLK by a prescribed time period, a tristate inverter buffer 224b which is brought into an operative state during the activation of operation mode instruction signal MODEb and inverts the output signal of delay circuit 224a, a 3-input NAND circuit 226 which receives clock enable signal ENCLK, internal clock signal intCLK, and an output signal from one of tristate inverter buffers 222b and 224b, and an inverter 228 which inverts an output signal from NAND circuit 226 and outputs an internal clock signal ωCLK. Internal clock signal ωCLK is applied to the column related control portion excluding output data transfer instruction signal generation circuit (DOT). At the time, in the latency counter, burst length counter, column select control circuit and reading control circuit, internal clock signal ωCLK may be applied to the circuit portion to which the pulse width of the internal clock signal has critical significance.

Figure 11:
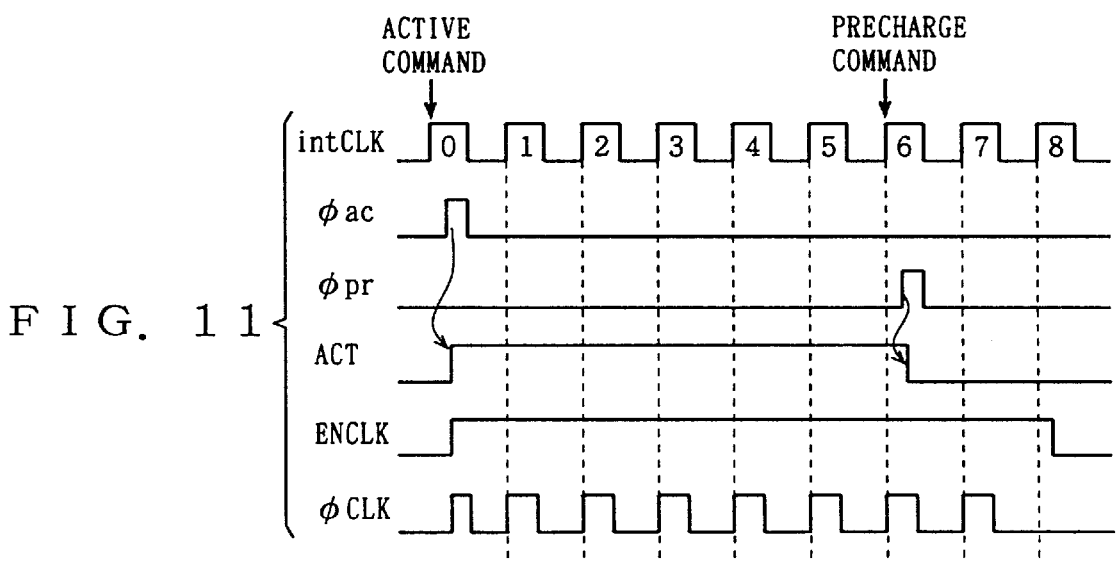
FIG. 11 is a timing chart for use in illustration of the operation of the internal clock generation circuit shown in FIG. 10.

Now, the operation of the internal clock generation portion shown in FIG. 10 will be described in conjunction with the timing chart in FIG. 11.

When an active command is supplied in clock cycle 0, active operation instruction signal ωac attains an H level active state during a prescribed time period, set/reset flipflop 18a included in row related control circuit 18 is set, and row related circuit activation signal ACT rises to an active H level. Set/reset flipflop 220b is set in response to the activation of row related circuit activation instruction signal ACT, and clock enable signal ENCLK also rises to an H level. One of operation mode instruction signals MODEa and MODEb is activated, and the other is set to an inactive state. Therefore, when clock enable signal ENCLK attains an H level active state, internal clock signal ωCLK having a pulse width corresponding to the delay time of delay circuit 222a or 224a is output in synchronization with a rising of internal clock signal intCLK.

In clock cycles 1 to 5, a read command or a write command is supplied, and data is read out or written. In this writing/reading operation, the column related control circuit operates in synchronization with internal clock signal ωCLK, accurate data transfer/writing may be performed according to an internal clock signal having an optimum pulse width depending upon the operation mode.

In clock cycle 6, a precharge command is supplied, and precharge operation instruction signal ωpr attains an H level active state for a prescribed time period. Set/reset flipflop 18a is reset in response to the activation of precharge operation instruction signal ωpr, and row related circuit activation instruction signal ACT attains an L level inactive state. In response to the inactivation of signal ACT, the row related control circuit stops a row select operation, and drives a selected word line to a non-selected state. More specifically, it executes the operations of driving a selected word line to a non-selected state, inactivation of a sense amplifier and precharging/equalizing of a bit line in a prescribed sequence. Note that the output signal of latency counter 220a is still in an active state in clock cycle 6. Therefore, clock enable signal ENCLK maintains its active state. Therefore, during the period data may be read out through the reading circuit and the output circuit in synchronization with internal clock signal øCLK.

If the CAS latency is 2, an output signal from latency counter 220a rises to an H level in clock cycle 8, set/reset flipflop 220b is reset accordingly, and clock enable signal ENCLK falls to an inactive L level. Thus, generation of internal clock signal øCLK is stopped. In clock cycle 8, necessary data has already been read out (the CAS latency is 2, and the remaining data of the burst length data is read out in clock cycles 6 and 7 after the application of the precharge command.)

As shown in FIG. 10, in the internal clock generation portion, the pulse width of internal clock signal øCLK is adjusted depending upon operation modes, while the pulse width of clock signal øCLK is also adjusted for a path under a critical condition (less margin) for data transfer in the circuit portion related to data writing/reading, and data transfer may be performed with enough margin as a result.

Variation

Figure 12:
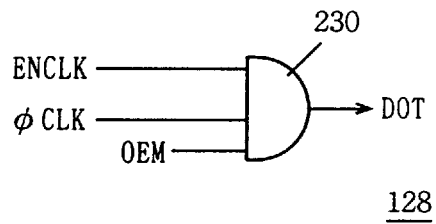
FIG. 12 is a diagram schematically showing the configuration of an output data transfer instruction signal generation circuit, using the internal clock generation circuit according to the third embodiment of the invention.

FIG. 12 is a diagram showing the configuration of a variation of the third embodiment of the invention. In FIG. 12, the output data transfer instruction signal generation circuit includes an AND circuit 230 which receives clock enable signal ENCLK, internal clock signal øCLK and output enable signal OEM. AND circuit 230 is used in place of output data transfer instruction signal generation circuit 128b shown in FIG. 8. In the configuration shown in FIG. 12, the pulse width of internal clock signal øCLK is adjusted depending upon the operation mode. Therefore, if various internal clock signals øCLK in column related control circuit 20 are all adjusted in common depending upon the operation mode, the number of components included in the internal clock generation portion may be reduced, and the area occupied by the circuit may be reduced as well. Also in this case, the clock pulse width to transfer and read out data may be set to an optimum value depending upon the operation mode, and therefore accurate data transfer results.

Note that although the number of components increases, a circuit for generating an internal clock signal having an adjustable pulse width may be provided to each of the column select control circuit, reading control circuit and output control circuit shown in FIG. 8.

Also in the third embodiment, using a test mode instruction signal for the operation instruction signal, a margin for an internal clock signal in a data transfer path may be measured as is the second embodiment. Internal clock signal øCLK is generated during the period of the sum of the activation period of row select circuit activation instruction signal ACT and the CAS latency period, internal clock signal øCLK may be generated and applied to the column related control circuit only for a necessary time period, and therefore the power consumption by the circuits operating in response to internal clock signal øCLK may be reduced.

As described above, according to the third embodiment, an internal clock signal is generated only during a period in which the circuit should operate, and the pulse width of the internal clock signal is changed depending upon the operation mode, and therefore the power consumption may be reduced and accurate data transfer operation may be performed.

Other Applications

In the foregoing description, data is selected and read out continuously on a 1-bit basis in a single memory block. However, columns may be brought into a selected state in a plurality of memory blocks, and memory cell data may be sequentially read out from each block by sequentially activating preamplifiers.

A "2-bit-prefetch" synchronous semiconductor memory device may be employed in which 2-bit memory cell data is latched by a single column selecting operation, and transferred sequentially in response to an internal clock signal.

In addition, the synchronous semiconductor memory device may be any semiconductor memory device which permits inputting/outputting of data in synchronization with an externally applied clock signal, and having a structure in which internal data transfer during reading is conducted in synchronization with an internal clock signal.

As in the foregoing, according to the present invention, an internal clock signal having an optimum pulse width depending upon operation environment may be generated, and accurate data transfer, particularly accurate data reading may be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous type semiconductor memory device capable of operating in a plurality of operations modes and permitting inputting and outputting of data in synchronization with an externally applied clock signal having a prescribed width, comprising:

internal clock generation means for generating an internal clock signal from said external clock signal;

pulse width setting means coupled to said internal clock generation means for setting a pulse width of said internal clock signal according to an operation mode specifying signal to specify an operation mode out of said plurality of operation modes; and internal circuitry operating in synchronization with said internal clock signal for performing a pre-allocated operation.

2. The synchronous type semiconductor memory device as recited in claim 1, further comprising a latch circuit responsive to a first edge of said internal clock signal for incorporating data and responsive to a second edge of said internal clock signal for latching the incorporated internal data and an output circuit for outputting said internal data externally when activated, wherein said pulse width setting means includes means for setting a time period from said first edge of said internal clock signal to said second edge according to said operation mode specifying signal.

3. The synchronous type semiconductor memory device as recited in claim 1, wherein said plurality of operation modes correspond to a latency indicating the number of cycles of said external clock signal necessary for outputting valid data externally since a data reading instruction is applied.

4. The synchronous type semiconductor memory device as recited in claim 3, wherein said pulse width setting means includes means for setting said pulse width longer when a first latency of said latency is specified than when a second latency longer than said first latency is specified.

5. The synchronous type semiconductor memory device as recited in claim 1, wherein said internal circuitry includes a data reading related circuit portion which operates when a reading instruction to instruct data reading is applied.

6. The synchronous type semiconductor memory device as recited in one of claim 3, further comprising means responsive to a memory cycle initiation instruction for validating said internal clock signal and responsive to a memory cycle ending instruction for stopping generation of said internal clock signal after said latency passes.

7. The synchronous type semiconductor memory device as recited in claim 1, wherein said operation mode specifying signal is a test operation mode specifying signal.

8. The synchronous type semiconductor memory device as recited in claim 1, further comprising;

mode register means for storing latency data indicating the number of cycles of said externally applied clock signal required for externally supplying data internally read out since application of a data read instruction, and means coupled to said mode register means for generating said operation mode specifying signal in accordance with said latency data.

* * * * *